United States Patent
Paatero

(10) Patent No.: US 11,404,902 B2
(45) Date of Patent: Aug. 2, 2022

(54) CONVERTER ASSEMBLY

(71) Applicant: ABB Schweiz AG, Baden (CH)

(72) Inventor: Esa-Kai Paatero, Vantaa (FI)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 17/073,628

(22) Filed: Oct. 19, 2020

(65) Prior Publication Data

US 2021/0119477 A1 Apr. 22, 2021

(30) Foreign Application Priority Data

Oct. 18, 2019 (EP) ..................... 19204078

(51) Int. Cl.
| | |
|---|---|
| H02J 9/06 | (2006.01) |
| G01R 19/165 | (2006.01) |
| G05F 1/618 | (2006.01) |
| H02J 7/00 | (2006.01) |

(Continued)

(52) U.S. Cl.
CPC ........ *H02J 9/062* (2013.01); *G01R 19/16538* (2013.01); *G05F 1/618* (2013.01); *H02J 7/0024* (2013.01); *H02J 7/0063* (2013.01); *H02J 7/345* (2013.01); *H02J 9/068* (2020.01); *H02M 3/158* (2013.01)

(58) Field of Classification Search
CPC ........ H02J 9/068; H02J 7/0063; H02J 7/0024; H02M 1/007; H02M 5/458; H02M 3/335; H02M 7/217; Y02B 10/70; G05F 1/618; G01R 19/16538

See application file for complete search history.

(56) References Cited

U.S. PATENT DOCUMENTS

| | | | | |
|---|---|---|---|---|
| 9,178,354 | B2* | 11/2015 | Oleynik | .................. H02J 9/062 |
| 10,770,893 | B2* | 9/2020 | Lehn | ..................... H02M 3/158 |
| 2011/0187197 | A1 | 8/2011 | Moth | |

(Continued)

FOREIGN PATENT DOCUMENTS

| | | |
|---|---|---|
| EP | 1710890 A2 | 10/2006 |
| EP | 1710890 A3 | 3/2009 |
| EP | 2068417 A1 | 6/2009 |

OTHER PUBLICATIONS

European Patent Office, Extended Search Report issued in corresponding Application No. 19204078.0, dated Apr. 2, 2020, 10 pp.

*Primary Examiner* — Jared Fureman
*Assistant Examiner* — Duc M Pham
(74) *Attorney, Agent, or Firm* — Leydig, Voit & Mayer, Ltd.

(57) ABSTRACT

A converter assembly including a source connection system including a primary source connection, and a plurality of secondary source connections, a load connection system including a load connection, a secondary source bus bar system, a switch system including a plurality of switch units each connected electrically between a corresponding secondary source connection and the secondary source bus bar system, and at least one converter module including a DC link and a secondary source side converter. Each switch unit of the switch system includes a first switch and a second switch connected in parallel, wherein the first switch has a higher switching speed than the second switch, and the second switch has a lower conduction losses than the first switch.

18 Claims, 1 Drawing Sheet

(51) Int. Cl.
*H02J 7/34* (2006.01)
*H02M 3/158* (2006.01)

(56) References Cited

U.S. PATENT DOCUMENTS

2012/0025614 A1 2/2012 Taimela et al.
2016/0096437 A1* 4/2016 Tripathi .................... H02J 7/00
307/31

* cited by examiner

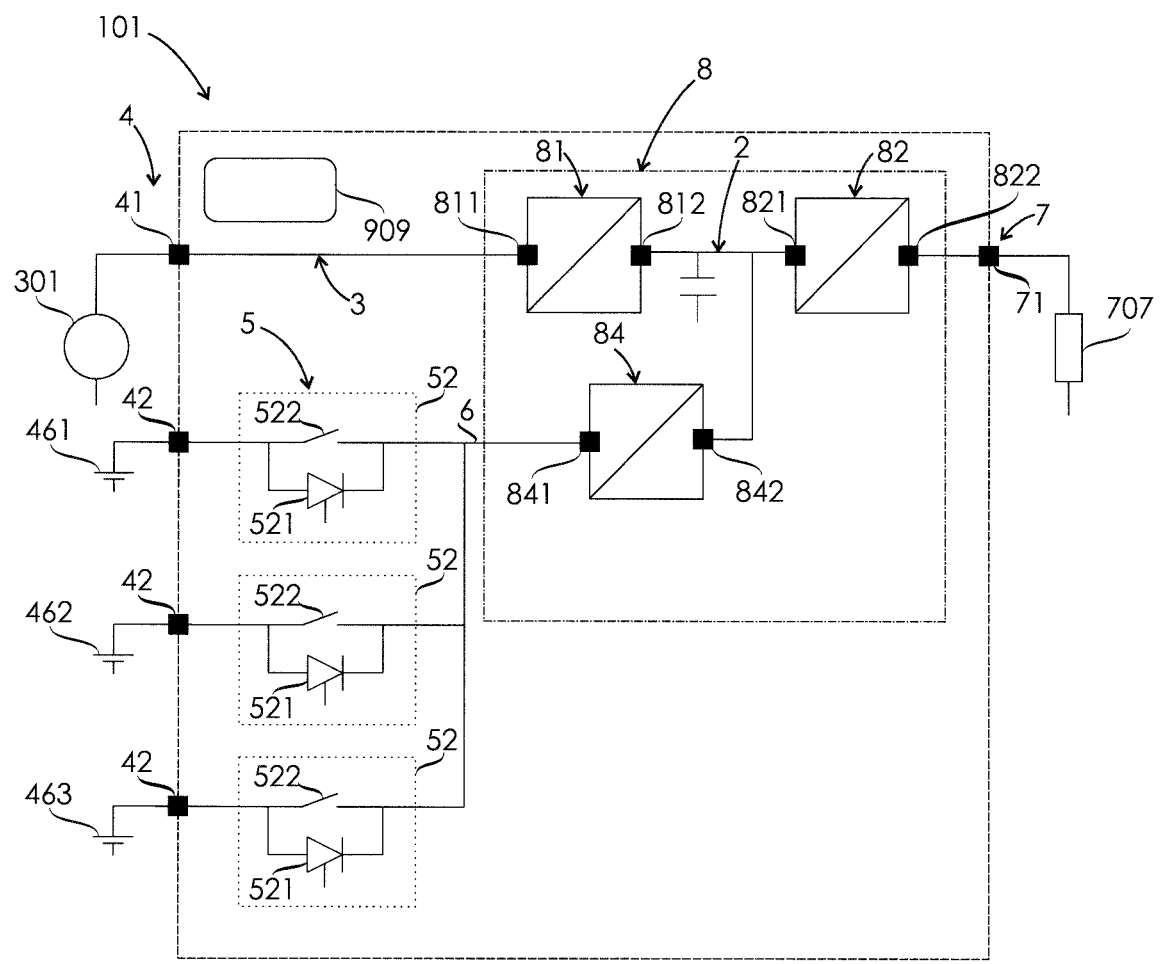

CONVERTER ASSEMBLY

FIELD OF THE INVENTION

The invention relates to a converter assembly, and more particularly to a converter assembly comprising a primary source connection and a plurality of secondary source connections.

A known converter assembly comprises a plurality of secondary source connections, and a control system adapted to select a suitable secondary current supply for each operating situation. One of the problems associated with the known converter assembly is that a switch system capable of realizing said changing of secondary current supplies fast is expensive and/or it has high energy losses.

A known converter assembly is described in publication US20120025614.

BRIEF DESCRIPTION OF THE INVENTION

An object of the present invention is to provide a converter assembly so as to solve the above problem. The objects of the invention are achieved by a converter assembly which is characterized by what is stated in the independent claim 1. The preferred embodiments of the invention are disclosed in the dependent claims.

The invention is based on the idea of providing a converter assembly with a switch system comprising a plurality of switch units each comprising a first switch and a second switch connected in parallel, wherein the first switch has a higher switching speed than the second switch, and the second switch has lower conduction losses than the first switch. The switch system comprises a switch unit for each secondary source connection of the converter assembly.

An advantage of the converter assembly of the invention is that the switch system enables changing secondary current supplies fast using the first switches of the switch units, while providing low conduction losses using the second switches of the switch units.

In an embodiment, a control system of the converter assembly is adapted to provide a connecting operation for connecting electrically one of a plurality of secondary source connections to a DC link of the converter assembly in order to supply energy between a secondary current supply connected to the secondary source connection, and the DC link. In the connecting operation, a first switch of a switch unit corresponding to the secondary source connection is closed first in order to achieve a short turn-on time. Subsequently, an electric current passing through the switch unit is transferred to a second switch of the switch unit by closing the second switch and opening the first switch. The first switch is only used for fast switching, and an electric current is transferred to the second switch as soon as possible, taking into account technical limitations and safety margins.

BRIEF DESCRIPTION OF THE DRAWINGS

In the following the invention will be described in greater detail by means of preferred embodiments with reference to the attached FIG. 1 that shows a simplified circuit diagram of a converter assembly according to an embodiment of the invention.

DETAILED DESCRIPTION OF THE INVENTION

FIG. 1 shows a simplified circuit diagram of a converter assembly 101 comprising a source connection system 4, a load connection system 7, a secondary source bus bar system 6, a secondary current supply system, a switch system 5, a converter module 8, and a control system 909.

The source connection system 4 comprises a primary source connection 41 adapted to be connected to a primary current supply 301, and three secondary source connections 42 each adapted to be connected to a corresponding secondary current supply of the secondary current supply system. Each of the secondary source connections 42 is a direct current connection. Secondary current supplies connected to the secondary source connections 42 are denoted with reference numbers 461, 462 and 463.

The load connection system 7 comprises a load connection 71 adapted to be connected to a load 707.

The converter module 8 comprises a primary source side converter 81, a DC link 2, a load side converter 82, and a secondary source side converter 84. The DC link 2 comprises DC link capacitance. The DC link 2 is connected electrically between the primary source connection 41 and the load connection 71 such that a first connection of the DC link 2 is connected electrically to the primary source connection 41 through the primary source side converter 81, and a second connection of the DC link 2 is connected electrically to the load connection 71 through the load side converter 82.

Herein, two components are defined to be connected electrically to each other when there is a connection between the components enabling transfer of electric energy between the components.

The primary source side converter 81 comprises a first connection 811 connected electrically to the primary source connection 41, and a second connection 812 connected electrically to the first connection of the DC link 2. The load side converter 82 comprises a first connection 821 connected electrically to a second connection of the DC link 2, and a second connection 822 connected electrically to the load connection 71.

The converter module 8 is a bidirectional converter module adapted to transfer energy both from the primary source connection 41 to the load connection 71, and from the load connection 71 to the primary source connection 41. In an alternative embodiment, the converter module of the converter assembly is a unidirectional converter module.

The primary current supply 301 is an alternating current supply, the primary source side converter 81 is a rectifier, the load side converter 82 is an inverter, and the load 707 is an alternating current load. In an alternative embodiment, the primary current supply is a direct current supply, and the primary source side converter is a direct-current converter, or the primary source side converter is omitted. In another alternative embodiment, the load is a direct current load, and the load side converter is a direct-current converter, or the load side converter is omitted.

The secondary source bus bar system 6 is connected electrically to the source connection system 4 through the switch system 5. In an embodiment, the switch system is a module adapted to be quickly connected to and disconnected from the secondary source bus bar system 6.

The secondary source side converter 84 is a bidirectional direct-current converter. The secondary source side converter 84 is connected electrically between the secondary source bus bar system 6 and the DC link 2 such that a first connection 841 of the secondary source side converter 84 is connected electrically to the secondary source bus bar system 6, and a second connection 842 of the secondary source side converter 84 is connected electrically to the DC link 2.

The switch system 5 comprises three switch units 52 each connected electrically between a corresponding secondary source connection 42 and the secondary source bus bar system 6. A first switch unit is connected electrically between the secondary current supply 461 and the secondary source bus bar system 6. A second switch unit is connected electrically between the secondary current supply 462 and the secondary source bus bar system 6. A third switch unit is connected electrically between the secondary current supply 463 and the secondary source bus bar system 6.

Each switch unit 52 of the switch system 5 comprises a first switch 521 and a second switch 522 connected in parallel, wherein the first switch 521 has a higher switching speed than the second switch 522, and the second switch 522 has lower conduction losses than the first switch 521.

The first switch 521 is a unidirectional switch, and the second switch 522 is a bidirectional switch. In an alternative embodiment, both the first switch and the second switch are bidirectional switches.

Both the first switch 521 and the second switch 522 are bistable switches. A turn-on time of the first switch 521 is less than one millisecond, while a turn-on time of the second switch 522 is at least ten times the turn-on time of the first switch 521.

The first switch 521 is a thyristor, and the second switch 522 is a mechanical switch. In an alternative embodiment, the first switch comprises a field-effect transistor, or FET. In another alternative embodiment, the first switch comprises an insulated-gate bipolar transistor, or IGBT.

The control system 909 is adapted to control the converter module 8 and the switch system 5. Thus, the control system 909 is adapted to control the primary source side converter 81, the load side converter 82, the secondary source side converter 84, and each of the switch units 52. The control system 909 is adapted to provide a connecting operation, a disconnecting operation, and a supply change operation.

The connecting operation comprises closing a first switch 521 of a switch unit 52 corresponding to one of the plurality of secondary source connections 42, closing a second switch 522 of the switch unit 52 subsequent to closing the first switch 521, and opening the first switch 521 of the switch unit 52 subsequent to closing the second switch 522. A short closing time is achieved by closing the first switch 521 first. Low conduction losses in a steady state are achieved by transferring current exclusively by the second switch 522.

Herein, a switch is open when it is in a non-conducting state, and closed when it is in a conducting state. Consequently, opening a switch is an event in which the switch is transferred from a conducting state to a non-conducting state, and closing a switch is an event in which the switch is transferred from a non-conducting state to a conducting state.

Closing a first switch 521 is realized by providing a current trigger to a gate of the first switch 521. Since the first switch 521 is a thyristor, it continues to conduct until a voltage across it is substantially removed, or reversed.

Closing a second switch 522 of a switch unit 52 substantially removes a voltage across a first switch 521 of the switch unit 52. Since the first switch 521 is a thyristor, substantially removing a voltage across the first switch 521 opens the first switch 521. Therefore, closing a second switch 522 of a switch unit 52 automatically opens a first switch 521 of the switch unit 52.

The disconnecting operation comprises in the beginning closing a first switch 521 of a switch unit 52 corresponding to one of the plurality of secondary source connections 42 while a second switch 522 of the switch unit 52 is in the closed state. Subsequently, the disconnecting operation comprises opening the second switch 522 of the switch unit 52, and boosting a voltage of the DC link 2 to a level over a steady state regulation level by controlling the secondary source side converter 84. Energy for said boosting is supplied through the one of the plurality of secondary source connections 42. After said boosting, the disconnecting operation comprises turning off the secondary source side converter 84 in order to facilitate opening of the first switch 521 of the switch unit 52. Finally the disconnecting operation comprises opening the first switch 521 of the switch unit 52. Since the first switch 521 is a thyristor, turning off the secondary source side converter 84 automatically opens the first switch 521.

The supply change operation comprises the above defined disconnecting operation and, subsequent to the disconnecting operation, the above defined connecting operation for connecting another of the plurality of secondary source connections 42 to the secondary source side converter 84 for supplying energy from the another of the plurality of secondary source connections 42 to the secondary source side converter 84. Subsequent to the connecting operation, the supply change operation comprises controlling a voltage of the DC link 2 to the steady state regulation level. The voltage of the DC link 2 was originally boosted in order to prevent dropping of the voltage below an acceptable value during the supply change operation. After the energy supply has been changed from one secondary current supply to another, there is no longer need to keep a voltage of the DC link 2 at a boosted level. In an embodiment, a voltage of the DC link is decreased from the boosted level, which is over a steady state regulation level, to the steady state regulation level by supplying energy from the DC link to the load of the converter assembly.

In one supply change operation, the secondary current supply 461 is disconnected from the secondary source side converter 84 by the disconnecting operation, and the secondary current supply 462 is connected to the secondary source side converter 84 by the connecting operation.

Each of the secondary current supplies 461, 462 and 463 is connected to a corresponding secondary source connection 42 of the source connection system 4. Each of the secondary current supplies 461, 462 and 463 has a different type than the other secondary current supplies such that cyclic and/or thermal performances of the secondary current supplies differ from each other.

The secondary current supply 461 is a rechargeable battery, the secondary current supply 462 is a capacitor, and the secondary current supply 463 is a kinetic source. In an alternative embodiment, secondary current supplies of the secondary current supply system comprise at least one of the following: a photovoltaic cell, a fuel cell, a wind power plant.

The control system 909 is adapted to provide a secondary current supply charging process comprising supplying energy from the DC link 2 to the secondary source connections 42 through the secondary source bus bar system 6. The secondary current supply charging process enables charging the secondary current supplies 461, 462 and 463 from the DC link 2. The secondary current supplies 461, 462 and 463 may be charged successively or in parallel with each other.

In an alternative embodiment, in which the control system is adapted to provide a secondary current supply charging process, both the first switch and the second switch of each switch unit are bidirectional switches.

In an alternative embodiment, the control system is not adapted to provide a secondary current supply charging process, and the secondary source side converter is a unidirectional direct-current converter.

The control system 909 is adapted to provide an equalization process for equalizing a voltage over a switch unit 52 before closing a first switch 521 and/or a second switch 522 of the switch unit 52. The equalization process comprises measuring a voltage of a secondary source connection 42 corresponding to the switch unit 52, and controlling the secondary source side converter 84 such that a voltage difference between the secondary source connection 42 and the first connection 841 of the secondary source side converter 84 is smaller than or equal to a predetermined limit value.

In an embodiment, the converter assembly is part of an uninterruptible power supply system.

It will be obvious to a person skilled in the art that the inventive concept can be implemented in various ways. The invention and its embodiments are not limited to the examples described above but may vary within the scope of the claims.

The invention claimed is:

1. A converter assembly comprising:
    a source connection system comprising a primary source connection adapted to be connected to a primary current supply, and a plurality of secondary source connections each adapted to be connected to a corresponding secondary current supply, each of the secondary source connections being a direct current connection;
    a load connection system comprising a load connection adapted to be connected to a load;
    a secondary source bus bar system;
    a switch system comprising a plurality of switch units each connected electrically between a corresponding secondary source connection and the secondary source bus bar system;
    at least one converter module comprising a DC link which comprises DC link capacitance, and is connected electrically between the primary source connection and the load connection, and a secondary source side converter connected electrically between the secondary source bus bar system and the DC link; and
    a control system adapted to control the at least one converter module and the switch system,
    wherein each switch unit of the switch system comprises a first switch and a second switch connected in parallel, wherein the first switch has a higher switching speed than the second switch, and the second switch has lower conduction losses than the first switch.

2. The converter assembly according to claim 1, wherein the control system is adapted to provide a connecting operation comprising:
    closing a first switch of a switch unit corresponding to one of the plurality of secondary source connections;
    closing a second switch of the switch unit subsequent to closing the first switch; and
    opening the first switch of the switch unit subsequent to closing the second switch.

3. The converter assembly according to claim 2, wherein the control system is adapted to provide a disconnecting operation comprising:
    closing a first switch of a switch unit corresponding to one of the plurality of secondary source connections while a second switch of the switch unit is in the closed state;
    opening the second switch of the switch unit subsequent to closing the first switch;
    boosting a voltage of the DC link to a level over a steady state regulation level by controlling the secondary source side converter of the at least one converter module,
    wherein energy for said boosting is supplied through the one of the plurality of secondary source connections;
    turning off the secondary source side converter of the at least one converter module in order to facilitate opening of the first switch of the switch unit; and
    opening the first switch of the switch unit.

4. The converter assembly according to claim 3, wherein the control system is adapted to provide a supply change operation comprising the disconnecting operation and, subsequent to the disconnecting operation, a connecting operation for connecting another of the plurality of secondary source connections to the secondary source side converter or supplying energy from the another of the plurality of secondary source connections to the secondary source side converter.

5. The converter assembly according to claim 4, wherein the supply change operation comprises, subsequent to the connecting operation, controlling a voltage of the DC link to the steady state regulation level.

6. The converter assembly according to claim 1, wherein the control system is adapted to provide a disconnecting operation comprising:
    closing a first switch of a switch unit corresponding to one of the plurality of secondary source connections while a second switch of the switch unit is in the closed state;
    opening the second switch of the switch unit subsequent to closing the first switch;
    boosting a voltage of the DC link to a level over a steady state regulation level by controlling the secondary source side converter of the at least one converter module, wherein energy for said boosting is supplied through the one of the plurality of secondary source connections;
    turning off the secondary source side converter of the at least one converter module in order to facilitate opening of the first switch of the switch unit; and
    opening the first switch of the switch unit.

7. The converter assembly according to claim 6, wherein the control system is adapted to provide a supply change operation comprising the disconnecting operation and, subsequent to the disconnecting operation, a connecting operation for connecting another of the plurality of secondary source connections to the secondary source side converter for supplying energy from the another of the plurality of secondary source connections to the secondary source side converter.

8. The converter assembly according to claim 7, wherein the supply change operation comprises, subsequent to the connecting operation, controlling a voltage of the DC link to the steady state regulation level.

9. The converter assembly according to claim 1, wherein the at least one converter module comprises a primary source side converter comprising a first connection connected to a second connection of the DC link, and a second connection connected electrically to the load connection.

10. The converter assembly according to claim 1, wherein the at least one converter module comprises a load side converter comprising a first connection connected to a second connection of the DC link, and a second connection connected electrically to the load connection.

11. The converter assembly according to claim 1, wherein the converter assembly comprises a secondary current supply system comprising a plurality of secondary current supplies each connected to a corresponding secondary source connection of the source connection system.

12. The converter assembly according to claim 11, wherein the plurality of secondary current supplies comprises secondary current supplies of different types, wherein the different types of secondary current supplies have different cyclic and/or thermal performances.

13. The converter assembly according to claim 12, wherein the plurality of secondary current supplies comprises at least two of the following types: a rechargeable battery, a capacitor, a kinetic source, a photovoltaic cell, a fuel cell, a wind power plant.

14. The converter assembly according to claim 1, wherein the secondary source side converter is a bidirectional converter adapted to transfer energy both from the secondary source bus bar system to the DC link, and from the DC link to the secondary source bus bar system, and the control system adapted to provide a secondary current supply charging process comprising supplying energy from the DC link to at least one of the plurality of secondary source connections.

15. The converter assembly according to claim 1, wherein the at least one converter module is a bidirectional converter module adapted to transfer energy both from the primary source connection to the load connection, and from the load connection to the primary source connection.

16. The converter assembly according to claim 1, wherein the control system is adapted to provide an equalization process for equalizing a voltage over a switch unit before closing a first switch and/or a second switch of the switch unit, wherein the equalization process comprises measuring a voltage of a secondary source connection corresponding to the switch unit, and controlling the secondary source side converter such that a voltage difference between the secondary source connection and the first connection of the secondary source side converter is smaller than or equal to a predetermined limit value.

17. The converter assembly according to claim 1, wherein the first switch is a switch whose turn-on time is less than one millisecond, and the second switch is a switch whose turn-on time is at least ten times the turn-on time of the first switch.

18. The converter assembly according to claim 1, wherein the first switch is a thyristor and the second switch is a mechanical switch.

* * * * *